United States Patent [19]
Fischman et al.

[11] 3,936,764
[45] Feb. 3, 1976

[54] FREQUENCY DISCRIMINATOR UTILIZING SURFACE WAVE DEVICES

[75] Inventors: Martin Fischman; G. Norman Williams, both of Seneca Falls, N.Y.; Jean M. Van Noppen, Kessel-Lo, Belgium

[73] Assignee: GTE Sylvania Incorporated, Stamford, Conn.

[22] Filed: Oct. 21, 1974

[21] Appl. No.: 516,174

[52] U.S. Cl.............. 329/117; 307/233 R; 329/112; 329/142; 329/204; 329/205 R; 333/72; 358/23
[51] Int. Cl.²...................... H03H 9/26; H03D 3/26
[58] Field of Search............ 329/112, 117, 140–143, 329/204, 205 R; 333/30 R, 72 R; 358/23; 307/233

[56] References Cited
UNITED STATES PATENTS

| | | | |
|---|---|---|---|
| 3,383,607 | 5/1968 | Avins | 329/205 R X |
| 3,417,336 | 12/1968 | Cribbs et al. | 307/233 X |
| 3,750,027 | 7/1973 | Hartmann | 329/140 X |
| 3,810,257 | 2/1973 | Jones et al. | 333/30 R |
| 3,835,422 | 9/1974 | Hartemann | 333/30 R X |
| 3,869,682 | 3/1975 | Heeks et al. | 333/30 R X |

*Primary Examiner*—John Kominski
*Attorney, Agent, or Firm*—Norman J. O'Malley; Robert E. Walrath; Robert T. Orner

[57] ABSTRACT

A frequency discriminator utilizing a pair of surface wave devices each comprising one transducer on a piezoelectric substrate connected in series with a signal source and a pair of envelope detectors connected in series with the surface wave devices is shown.

8 Claims, 6 Drawing Figures

FREQUENCY DISCRIMINATOR UTILIZING SURFACE WAVE DEVICES

CROSS-REFERENCE TO RELATED APPLICATIONS

Fischman et al., "Surface Wave Frequency Discriminator," Ser. No. 417,036, filed Nov. 19, 1973, now abandoned; and Fischman et al., "Frequency Discriminator Utilizing Surface Wave Devices," Ser. No. 516,175, filed Oct. 21, 1974; both assigned to the same assignee as this application.

BACKGROUND OF THE INVENTION

This invention relates to frequency discriminators utilizing surface wave devices and more particularly to frequency discriminators utilizing a pair of surface wave devices each having a single transducer.

Surface wave devices have found a number of applications as frequency selective or responsive devices such as in filters, frequency discriminators, and the like. Such devices normally comprise one or more interdigital transducers disposed on a substrate of piezoelectric material such as lithium niobate, lithium tantalate, PZT, quartz, zinc oxide, zinc sulfide, or cadmium sulfide. Of the various possible piezoelectric materials, lithium niobate is presently preferred, however, depending upon the application and the frequencies of interest, other materials may be used as well and may in some cases be preferred. Surface wave devices possess a number of advantages over frequency responsive circuits constructed of discrete components such as small size, compatability with integrated circuits, relatively invariant characteristics, bulk fabrication, and the like.

Prior art frequency discriminators utilizing surface wave devices have generally included transmitting and receiving transducers disposed on a piezoelectric substrate. Such devices, however, have parasitic responses due to various parasitic effects such as side lobe responses, bulk wave coupling, capacitive and inductive coupling, and the like. Such parasitic effects deleteriously affect the performance of such prior art frequency discriminators. Furthermore, prior art frequency discriminators utilizing transmitting and receiving transducers require relatively complex design and fabrication techniques and have a relatively high insertion loss or low efficiency.

Attempts to circumvent the disadvantages of frequency discriminators utilizing transmitting and receiving transducers have been generally unsuccessful. Some prior art attempts involve the use of designs including surface wave devices with single transducers, however, these prior art techniques have also resulted in transducers with low efficiency and inadequate or deleterious performance.

OBJECTS AND SUMMARY OF THE INVENTION

Accordingly, it is a primary object of this invention to provide frequency discriminators utilizing surface wave devices which obviate the above-noted and other disadvantages of the prior art.

It is a further object of this invention to provide frequency discriminators utilizing surface wave devices with high efficiency and low insertion losses.

It is a further object of this invention to provide frequency discriminators utilizing surface wave devices which can be fabricated using relatively uncomplicated and simple techniques.

It is a further object of this invention to provide frequency discriminators utilizing surface wave devices which have superior preformance.

It is a yet further object of this invention to provide frequency discriminators utilizing surface devices which are not deleteriously affected by various parasitic responses.

In one aspect of this invention the above and other objects and advantages are achieved in a frequency discriminator including a signal source, first and second surface wave devices, and first and second envelope detectors. The signal source provides a signal having frequencies that vary about a center frequency. Each of the surface wave devices has a transducer with first and second combs of interleaved electrodes disposed on a piezoelectric substrate. The surface wave devices also have impedance maximums at frequencies lower and higher, respectively, than the center frequency. The first surface wave device and first envelope detector are connected in series with the signal source and the second surface wave device and second envelope detector are also connected in series with the signal source for providing first and second output signals which are summed to provide a signal having an amplitude representative of the frequency deviation of the signal provided by the signal source from the center frequency.

DETAILED DESCRIPTION OF THE PREFERRED EMBODIMENTS

For a better understanding of the present invention, together with other and further objects, advantages and capabilities thereof, reference is made to the following disclosure in conjunction with the accompanying drawings.

Figure 1:
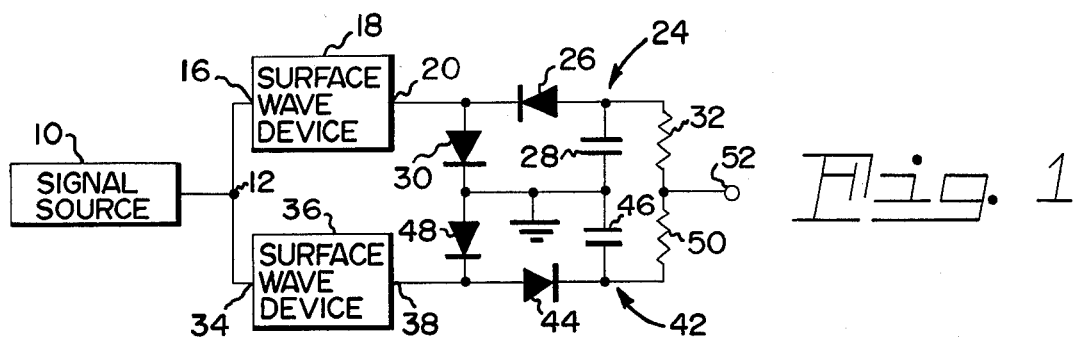
FIG. 1 is a block and schematic diagram of one embodiment of the invention.

In FIG. 1 a signal source 10 is shown which provides a signal having frequencies that vary about a center frequency to a terminal 12. The nature or characteristics of the signal provided by signal source 10 will vary depending upon the application of a frequency discriminator in accordance with the invention. For example, if the frequency discriminator is used in an automatic frequency control (AFC) system in a television receiver, signal source 10 will include an intermediate frequency amplifier stage and the center frequency will typically be 45.75 mHz. In an AFC system the output signal will be applied to a DC of error amplifier coupled to the radio frequency oscillator in the tuner. If, however, the frequency discriminator is used to demodulate an FM signal, such as an intercarrier beat signal in a television receiver, signal source 10 can include the intercarrier detector and the signal provided thereby will typically have a center frequency of 4.5 mHz. In such applications the output signal from the frequency discriminator will typically be coupled to an audio amplifier. Those skilled in the art will realize, however, that a frequency discriminator in accordance with the invention is not limited to television circuitry and may be used, for example, in other FM demodulators and AFC systems as well as in other applications where frequency discriminators are typically used.

Terminal 12 is connected to one terminal 16 of a surface wave device 18 which has a second terminal 20 connected to an envelope detector 24. Envelope detector 24 includes a diode 26 having its cathode connected to terminal 20 and its anode connected by a capacitor 28 to circuit ground. Another diode 30 is connected between the cathode of diode 26 and circuit ground. A resistor 32 is connected between the anode of diode 26 and a terminal 52 which comprises the output terminal of the frequency discriminator.

Terminal 12 is further connected to one terminal 34 of a surface wave device 36 which has a second terminal 38 connected to a second envelope detector 42. Envelope detector 42 has a diode 44 with its anode connected to terminal 38 and its cathode connected by a capacitor 46 to circuit ground. Another diode 48 is connected from circuit ground to the anode of diode 44. A resistor 50 is connected between the cathode of diode 44 and output terminal 52. Resistors 32 and 50 comprise a means for summing the output signals from envelope detectors 24 and 42.

Accordingly, surface wave device 18 and envelope detector 24 are connected in series with signal source 10. Furthermore, surface wave device 36 and envelope detector 42 are also connected in series with source 10.

Figure 2A:
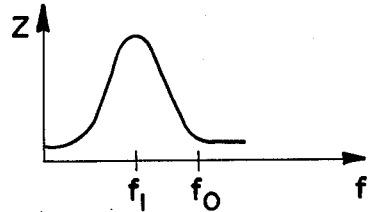
FIGS. 2A, 2B, and 2C are graphs of impedance vs frequency for the surface wave devices used in the invention.
Figure 2B:
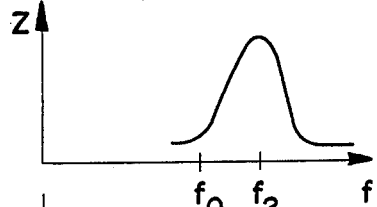
Figure 2C:
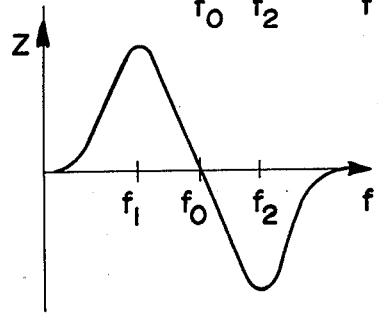

Surface wave device 18 has an amplitude vs frequency response similar to that illustrated in FIG. 2A where $f_0$ is the center frequency of the over-all discriminator response and $f_1$ is the frequency at which surface wave device 18 has an impedance maximum. Similarly, surface wave device 36 has an amplitude vs frequency response similar to that illustrated in FIG. 2B wherein $f_2$ is the frequency at which surface wave device 36 has an impedance maximum. Frequencies $f_1$ and $f_2$ are determined primarily by the geometry of the transducers in surface wave devices 18 and 36. The frequencies are selected such that the composite or over-all frequency response illustrated in FIG. 2C is obtained.

Surface wave devices 18 and 36 convert the signal from signal source 10 into an amplitude modulated signal or a signal with amplitude variations dependent upon the frequency deviation from the center frequency $f_0$. Envelope detectors 24 and 42 detect the amplitude modulations or variations to provide first and second output signals which are summed by resistors 32 and 50 to provide a composite output signal having an amplitude representative of the frequency deviation of the signal provided by source 10 from the center frequency $f_0$. Resistors 32 and 50 also provide DC returns for capacitors 28 and 46.

Diodes 30 and 48 provide a DC return for surface wave devices 18 and 36. Diodes 30 and 48 can be replaced by resistors, however, the diodes also provide voltage doubling action. Diode 30 clamps the output of device 18 to circuit ground during positive voltage swings. Similarly, diode 48 clamps the output of device 36 to circuit ground during negative voltage swings thereby providing voltage doubling action. It should also be noted that the phase of the output signal at terminal 52 can be reversed by reversing the polarity of diodes 26, 30, 44, and 48. Similarly, the phase of the output signal can be reversed by exchanging surface wave devices 18 and 36.

Figures 3, 4:
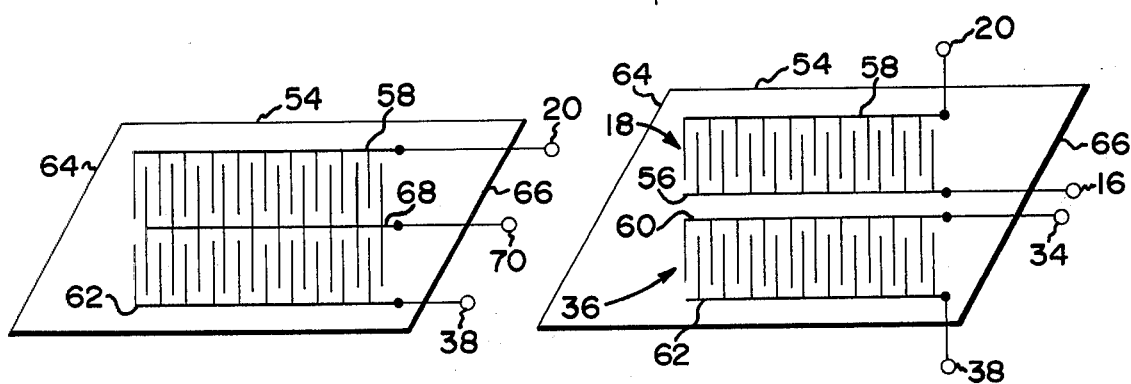
FIGS. 3 and 4 are alternate embodiments of surface wave devices in accordance with the invention.

Surface wave devices 18 and 36 can have separate substrates, however, each preferably includes a single transducer of the interdigital type disposed on a common piezoelectric substrate such as lithium niobate. FIG. 3 is one form of a surface wave device wherein both of devices 18 and 36 are incorporated on a common substrate 54. Device 18 includes an interdigital transducer with first and second combs of electrodes connected to terminals 16 and 20 respectively. The first comb of electrodes includes a base electrode 56, from which the connection to terminal 16 is made, and a plurality of fingers connected thereto. The second comb of electrodes includes a base electrode 58 connected to terminal 20 and a plurality of fingers connected thereto. The fingers of the first and second combs are interleaved to form an interdigital transducer. Device 36 also includes a single transducer with a first comb of electrodes including a base electrode 60 connected to terminal 34 and having a plurality of fingers connected thereto and a second comb of electrodes including a base electrode 62 connected to terminal 38 and having a plurality of fingers connected thereto interleaved with the fingers connected to base electrode 60 to form an interdigital transducer.

The geometry of transducers 18 and 36 determine their frequency characteristics. The primary variables for determining the frequency characteristics are the number of fingers, the spacing between fingers, and the width of fingers. In typical transducers the widths of the fingers and spacing between adjacent pairs of fingers is one-half wave length. In other words, transducer 18 has spacings between adjacent fingers and widths of fingers corresponding to one-half wave length at frequency $f_1$ while transducer 36 has similar geometric characteristics for frequency $f_2$. The number of fingers is the primary determinate for the band width or Q of the response with the Q increasing with increasing numbers of pairs of fingers.

The ends 64 and 66 of substrate 54 are preferably cut at an appropriate angle so that surface waves transmitted by transducers 18 and 36 reflect at angles such that transducers 18 and 36 do not interact with each other. Furthermore, damping matetial such as wax can be placed on ends 64 and 66 to absorb incident surface waves.

FIG. 4 is a schematic illustration of another embodiment of surface wave devices 18 and 36 wherein both devices are on a common substrate and in addition base electrodes 56 and 60 are replaced by a base electrode 68 common to the first combs of electrodes of transducers 18 and 36. Common base electrode 68 is connected to a terminal 70 which replaces terminals 16 and 34 and corresponds to terminal 12 at the output of source 10.

Accordingly, various embodiments of the invention and variations and modifications thereof have been illustrated and described. Frequency discriminators in accordance with the invention provide numerous advantages over the prior art such as extended frequency capabilities, high efficiency, uncomplicated fabrication techniques, alleviation of side lobe responses and other parasitic effects, and other similar advantages.

While there has been shown and described what is at present considered the preferred embodiments of the invention it will be obvious to those skilled in the art that various changes and modifications may be made therein without departing from the invention as defined by the appended claims.

We claim as our invention:

1. A frequency discriminator comprising:
   a signal source having a terminal for providing a signal at said terminal having frequencies that vary about a center frequency;
   first and second surface wave devices each having a single transducer with first and second combs of interleaved electrodes disposed on a piezoelectric substrate, said first and second surface wave devices having impedance maximums at frequencies lower and higher, respectively, than said center frequency;
   first and second envelope detectors;
   means connecting said first comb of electrodes of said first and second surface wave devices to said terminal of said signal source and further connecting said second comb of electrodes of said first and second surface wave devices to said first and second envelope detectors, respectively, for providing first and second output signals; and
   means connected to said first and second envelope detectors for summing said first and second output signals to provide a signal having an amplitude representative of the frequency deviation of the signal provided by said signal source from said center frequency.

2. A frequency discriminator as defined in claim 1 wherein the transducers of said first and second surface wave devices are disposed on a common substrate.

3. A frequency discriminator as defined in claim 2 wherein one comb of electrodes of the transducer of said first surface wave device has a common base electrode with one comb of electrodes of the transducer of said second surface wave device.

4. A frequency discriminator as defined in claim 1 wherein said first and second envelope detectors each include a voltage doubler.

5. A frequency discriminator comprising:
   a signal source having a terminal for providing a signal at said terminal having frequencies that vary about a center frequency;
   a first surface wave device having a single transducer with first and second combs of interleaved electrodes disposed on a piezoelectric substrate and an impedance maximum at a frequency lower than said center frequency;
   a first envelope detector;
   means connecting said first comb of electrodes of said first surface wave device to said terminal of said signal source and said second comb of electrodes of said first surface wave device to said envelope detector for providing a first output signal;
   a second surface wave device having a single transducer with first and second combs of interleaved electrodes disposed on a piezoelectric substrate and an impedance maximum at a frequency higher than said center frequency;
   a second envelope detector;
   means connecting said first comb of electrodes of said second surface wave device to said terminal of said signal source and said second comb of electrodes of said second surface wave device to said second envelope detector for providing a second output signal; and
   means connected to said first and second envelope detectors for summing said first and second output signals to provide a signal having an amplitude representative of the frequency deviation of the signal provided by said signal source from said center frequency.

6. A frequency discriminator as defined in claim 5 wherein the transducers of said first and second surface wave devices are disposed on a common substrate.

7. A frequency discriminator as defined in claim 6 wherein one comb of electrodes of the transducer of said first surface wave device has a common base electrode with one comb of electrodes of the transducer of said second surface wave device.

8. A frequency discriminator as defined in claim 5 wherein said first and second envelope detectors each include a voltage doubler.

* * * * *

UNITED STATES PATENT OFFICE
CERTIFICATE OF CORRECTION

PATENT NO. : 3,936,764
DATED : Feb. 3, 1976
INVENTOR(S) : Martin Fischman, G. Norman Williams, Jean M. VanNoppen It is certified that error appears in the above–identified patent and that said Letters Patent are hereby corrected as shown below:

On the first page add the joint assignee GTE International Incorporated, Stamford, Conn.

Signed and Sealed this

Sixth Day of July 1976

[SEAL]

Attest:

RUTH C. MASON
*Attesting Officer*

C. MARSHALL DANN
*Commissioner of Patents and Trademarks*